(12) United States Patent
Zrafi (10) Patent No.: US 11,728,765 B2
(45) Date of Patent: Aug. 15, 2023

(54) CLEANING SYSTEM FOR A CIRCULAR PANEL

(71) Applicant: Rached Zrafi, Quebec (CA)

(72) Inventor: Rached Zrafi, Quebec (CA)

(*) Notice: Subject to any disclaimer, the term of this patent is extended or adjusted under 35 U.S.C. 154(b) by 0 days.

(21) Appl. No.: 17/853,636

(22) Filed: Jun. 29, 2022

(65) Prior Publication Data

US 2023/0049831 A1 Feb. 16, 2023

(51) Int. Cl.
| | |
|---|---|
| H02S 40/10 | (2014.01) |
| H02S 40/12 | (2014.01) |
| B08B 1/00 | (2006.01) |
| B08B 3/02 | (2006.01) |
| B08B 1/04 | (2006.01) |
| F24S 40/20 | (2018.01) |

(52) U.S. Cl.
CPC ............. *H02S 40/12* (2014.12); *B08B 1/002* (2013.01); *B08B 1/005* (2013.01); *B08B 1/04* (2013.01); *B08B 3/024* (2013.01); *F24S 40/20* (2018.05); *H02S 40/10* (2014.12)

(58) Field of Classification Search
CPC ...................................................... H02S 40/12
See application file for complete search history.

(56) References Cited

U.S. PATENT DOCUMENTS

| | | | |
|---|---|---|---|
| 1,269,395 A | 6/1918 | Cranston | |
| 1,920,144 A | 7/1933 | Hueber et al. | |
| 2,100,055 A | 11/1937 | Horton | |
| 2,178,068 A | 10/1939 | Cordova | |
| 2,246,740 A | 6/1941 | Lethbridge | |
| 2,288,429 A | 6/1942 | Baughn | |
| 2,737,658 A | 3/1956 | Poeder | |
| 2,884,656 A | 5/1959 | Bryant | |
| 3,076,990 A | 2/1963 | Dapprich | |
| 3,546,732 A | 12/1970 | Kuester | |
| 3,736,617 A | 6/1973 | Ahlen | |
| 5,065,471 A | 11/1991 | Laplante | |
| 5,255,407 A | 10/1993 | Yang | |

FOREIGN PATENT DOCUMENTS

CN 210979666 * 7/2020

OTHER PUBLICATIONS

Translation of CN210979666 by Zhan et al., published Jul. 10, 2020 (Year: 2020).*

* cited by examiner

*Primary Examiner* — Eric W Golightly
*Assistant Examiner* — Ryan L Coleman

(57) ABSTRACT

A cleaning system for cleaning a circular panel or any other circular surface is provided. The system has a base mechanically fastened to the circular panel. An axis stub pivotally connected to the base and attached to a pivot member provides rotation for a blade set. The blade set includes a first blade and a second blade configured to rotate independently about the pivot member in either a clockwise or a counter clockwise direction, wherein the second blade is configured to sit above the first bade, each blade having at least one row of sprinkler holes positioned on each side of the blade running lengthwise. The at least one row of sprinkler holes are configured to eject a fluid to either clean, cool, or thaw the circular panel. The first blade includes a roller having cleaning implements configured to clean the circular panel as the first blade rotates about the pivot member.

12 Claims, 9 Drawing Sheets

CLEANING SYSTEM FOR A CIRCULAR PANEL

CROSS-REFERENCE TO RELATED APPLICATIONS

The present application claims priority to application number GB2111682.7, filed on Aug. 13, 2021, the disclosure of which is hereby incorporated in its entirety at least by reference.

BACKGROUND OF THE INVENTION

1. Field of the Invention

The present invention relates generally cleaning equipment but more particularly to a cleaning system for a circular panel.

2. Description of Related Art

The use of solar panels is becoming ubiquitous. A big problem is how to keep them clean without the need for a lot of manpower. There are also other surfaces that need to be kept clean, such as reflective surfaces whether bright white or mirror surfaces.

There are many systems that have been invented for automatically cleaning glass or mirrors and some of those systems can also be used for cleaning the surface of solar water heaters or photovoltaic panels.

For example British patent GB222225 describes a car mirror with a windscreen wiper, comprising a shell, a silvered mirror, a windscreen wiping rod which is adhered with the mirror, and a rotary shaft which penetrates through a centre hole of the mirror. The inner chamber end of the rotary shaft in the shell is connected with fan blades, the back surface of the shell is provided with an air inlet hole, and the lower surface of the shell is provided with an air outlet hole. The shell is further provided with an air inlet hole plug. High-speed airflow enters the air inlet hole arranged on the back surface of the shell while car runs in rainy days so as to blow the fan blades in the inner chamber of the shell, and then the windscreen wiping rod is driven to rotate through the rotary shaft to wipe the irregular raindrops on the mirror, so that the driving safety can be ensured, and motors and batteries are not needed. After the air inlet hole is plugged though the plug, the windscreen wiping rod stops.

Chinese patent CN104324913 describes a flying saucer type photovoltaic cell panel cleaner and a cleaning method thereof, which belong to the field of remotely controlled flying cleaning. The flying saucer type photovoltaic cell panel cleaner comprises a cleaning system, a power system, a control system, a flying system, a communication system and a remote control system; the flying system, the cleaning system, the power system, the control system and the communication system compose a control and actuation mechanism, i.e. a cleaner host, the remote control system composes a remote control mechanism alone, signals are transmitted and received between the remote control system and the cleaner host through wireless communication modules in signal transceiver ports, the remote control system is utilized to set a route and transmit control signals, and the cleaner flies to a target cleaning position (i.e. a photovoltaic cell module to be cleaned) to perform corresponding action to fulfil a sweeping, sucking or wiping process. The flying saucer type photovoltaic cell panel cleaner has a simple structure, is convenient to maintain, is low in cost, and can conveniently clean solar photovoltaic cell panels placed at high positions.

U.S. Pat. No. 5,065,471 describes a water spraying windshield wiper of an automobile, belongs to the field of automobile accessories, and in particular discloses an automatic windshield wiper capable of spraying water. The water spraying windshield wiper of the automobile comprises a windshield wiper body which is equipped with a windshield wiper driving arm connecting seat. The water spraying windshield wiper of the automobile is characterized in that the windshield wiper body comprises an inner side scraper plate and an outer side scraper plate which are parallel to each other; a water pipe is arranged between the inner side scraper plate and the outer side scraper plate and parallel to the inner side scraper plate and the outer side scraper plate; water spraying openings which are uniformly distributed are arranged at one side of the water pipe, close to glass. The water spraying windshield wiper of the automobile has the beneficial effects that a water spraying device is integrated with the windshield wiper; the water spraying openings in the water pipe are relatively small in aperture, so that water sprayed to the glass can be uniform and small in quantity, and as a result, the water sprayed on the windshield wiper can be timely scraped by the windshield wiper, and the shortage that the glass is fuzzy within a short time when wiping the front windshield by the existing common windshield wiper; meanwhile, the water spraying device and the windshield wiper are integrated, so that water can be only sprayed to the part which can be wiped by the windshield wiper, and the sprayed water is uniform and small in quantity, so that the water can be saved.

BRIEF SUMMARY OF THE INVENTION

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

It is a main object of the present disclosure to provide a cleaning system for a circular panel. It is another object of the present invention to provide a system that can clean any circular surface that needs cleaning such as solar water heaters, mirrors and lenses.

In order to do so, a cleaning system for a circular panel is provided, comprising a blade having a proximal end pivotally connected to a pivot member; a base mechanically fastened to the circular panel; an axis stub pivotally connected to the base and attached to the pivot member; and, wherein the blade is configured to rotate about the circular panel via the pivot member to clean the circular panel.

In one embodiment, the blade is comprised of a first blade and a second blade. In another embodiment, the first blade and the second blade are configured to rotate independently either in a clockwise or a counter clockwise direction. In another embodiment, the first blade and the second blade each comprises at least one row of sprinkler holes configured to eject one or more fluids. In one embodiment, the at least one row of sprinkler holes is a pair of rows positioned on each side of the first blade and the second blade. In one embodiment, the one or more fluids is a cleaning fluid configured to clean or cool the circular panel and a thawing fluid configured to thaw snow or ice from the circular panel. In another embodiment, the first blade is comprised of a roller having implements, wherein the roller is configured to rotate via an electric motor. In yet another embodiment, the implements include hard scrubbers, brushes, and squeegees. In one embodiment, the second blade is configured to sit above the first blade. In another embodiment, the second blade is comprised of a brush that extends upwardly. In one embodiment, the second blade is configured to wipe excess snow off the circular panel. In another embodiment, a wind vane positioned on a top portion of the pivot member is provided, wherein the wind vane is connected to a charger for generating electricity for operating the cleaning system. In one embodiment, the circular panel is a solar panel.

In another aspect of the invention, a cleaning system for a circular panel is provided, comprising a base mechanically fastened to the circular panel; an axis stub pivotally connected to the base and attached to a pivot member; a first blade and a second blade configured to rotate independently about the pivot member in either a clockwise or a counter clockwise direction, wherein the second blade is configured to sit above the first blade, each blade having at least one row of sprinkler holes positioned on each side of the blade running lengthwise; wherein the at least one row of sprinkler holes are configured to eject a fluid to either clean, cool, or thaw the circular panel; and, wherein the first blade comprises a roller having cleaning implements configured to clean the circular panel as the first blade rotates about the pivot member.

The foregoing has outlined rather broadly the more pertinent and important features of the present disclosure so that the detailed description of the invention that follows may be better understood and so that the present contribution to the art can be more fully appreciated. Additional features of the invention will be described hereinafter which form the subject of the claims of the invention. It should be appreciated by those skilled in the art that the conception and the disclosed specific methods and structures may be readily utilized as a basis for modifying or designing other structures for carrying out the same purposes of the present disclosure. It should be realized by those skilled in the art that such equivalent structures do not depart from the spirit and scope of the invention as set forth in the appended claims.

BRIEF DESCRIPTION OF THE SEVERAL VIEWS OF THE DRAWINGS

Other features and advantages of the present invention will become apparent when the following detailed description is read in conjunction with the accompanying drawings, in which.

DETAILED DESCRIPTION OF THE PREFERRED EMBODIMENT

The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein to specifically provide a cleaning system for a circular panel.

It is to be understood that the terminology used herein is for the purpose of describing particular embodiments only and is not intended to be limiting. The terms "a" or "an," as used herein, are defined as to mean "at least one". The term "plurality," as used herein, is defined as two or more. The term "another," as used herein, is defined as at least a second or more. The terms "including" and/or "having," as used herein, are defined as comprising (i.e., open language). The term "coupled," as used herein, is defined as connected, although not necessarily directly, not necessarily mechanically, and not permanent. The term "providing" is defined herein in its broadest sense, e.g., bringing/coming into physical existence, making available, and/or supplying to someone or something, in whole or in multiple parts at once or over a period of time. As used herein, the terms "about", "generally", or "approximately" apply to all numeric values, whether or not explicitly indicated. These terms generally refer to a range of numbers that one of skill in the art would consider near the stated amount by about 0%, 5%, or 10%, including increments therein. In many instances these terms may include numbers that are rounded to the nearest significant figure.

Referring now to any of the accompanying FIGS. 1-8, according to a first embodiment, a cleaning system 10 for a circular panel 12 is provided, wherein the system 10 is comprised of a blade 14 having a proximal end 16 that is pivotally attached to the circular panel 12 by way of a dome shaped pivot member 18. In one embodiment, the blade 14 is divided into a first blade 15 and a second blade 17. In one embodiment, the first blade is comprised of a roller 40.

Figure 1:
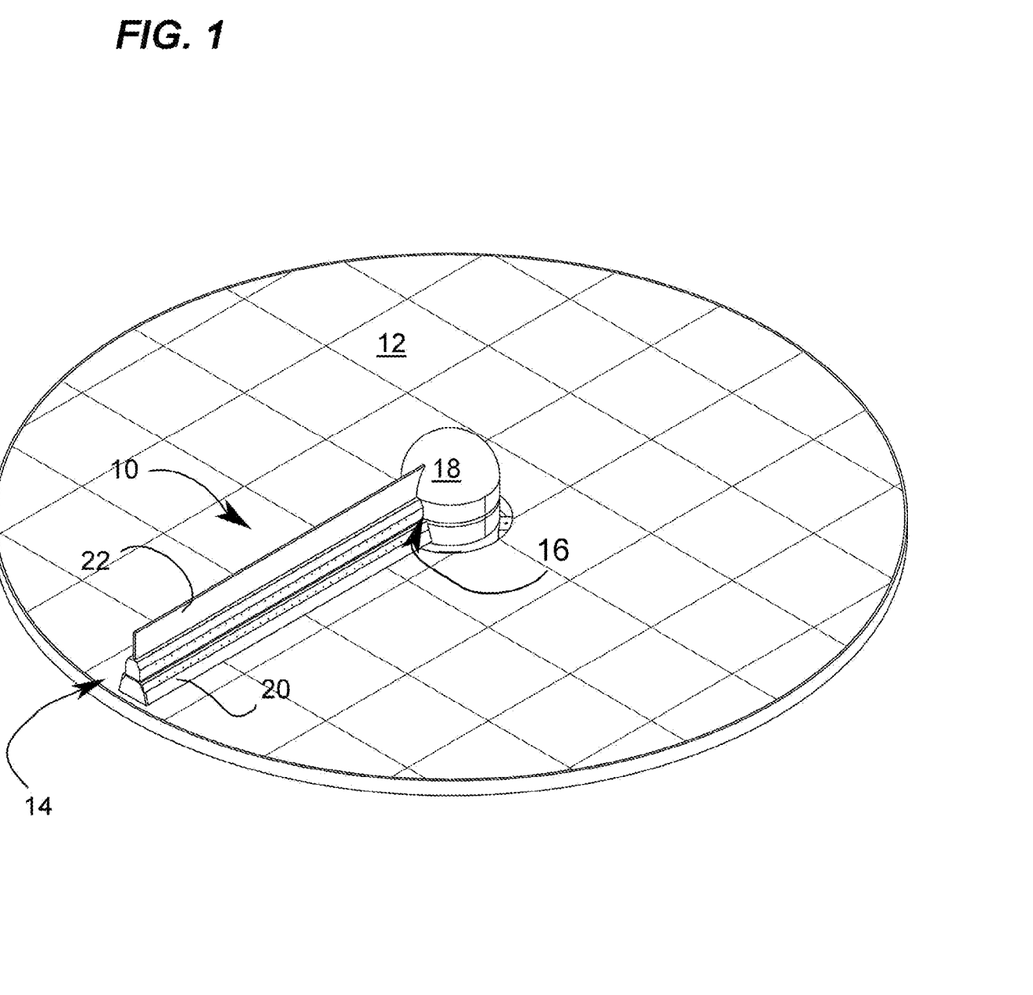
FIG. 1 is an isometric view according to an embodiment of the invention.
Figure 2:
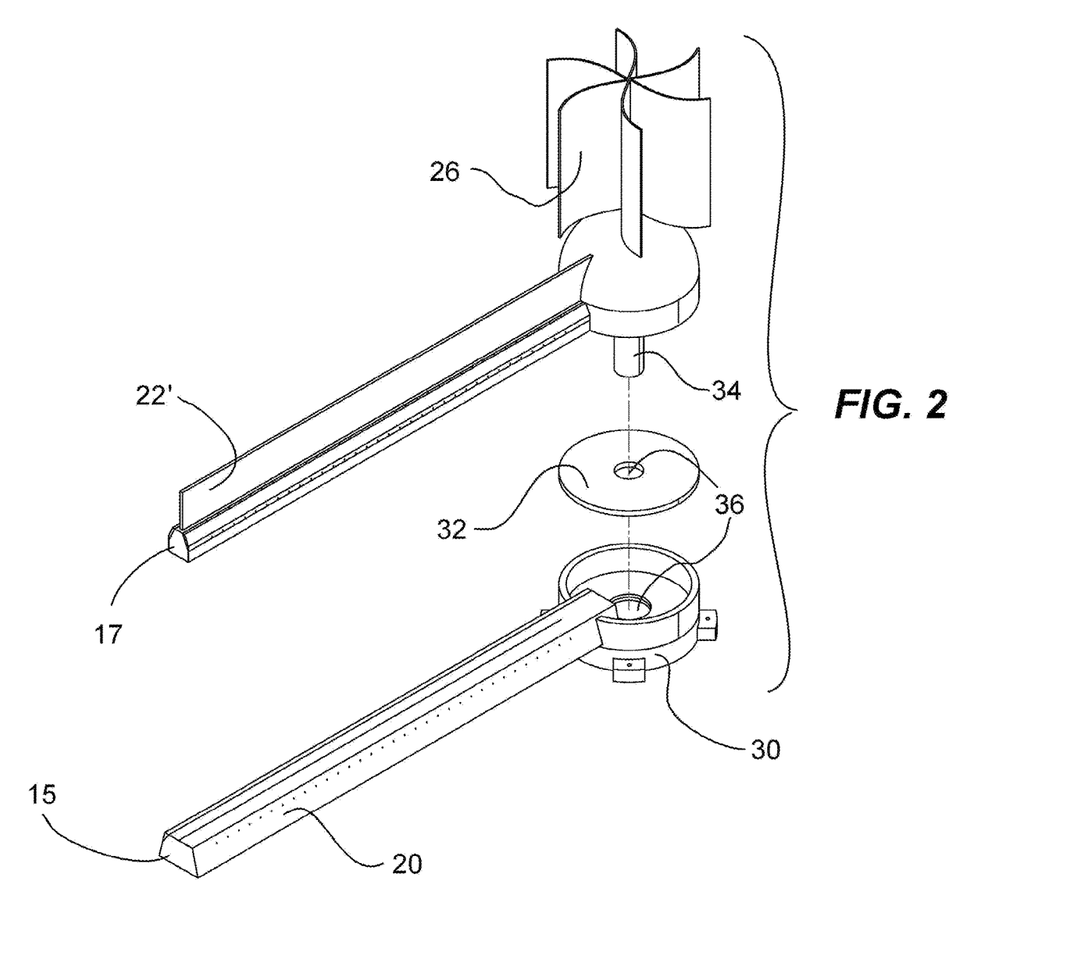
FIG. 2 is an exploded view of the invention.
Figures 3A, 3B:
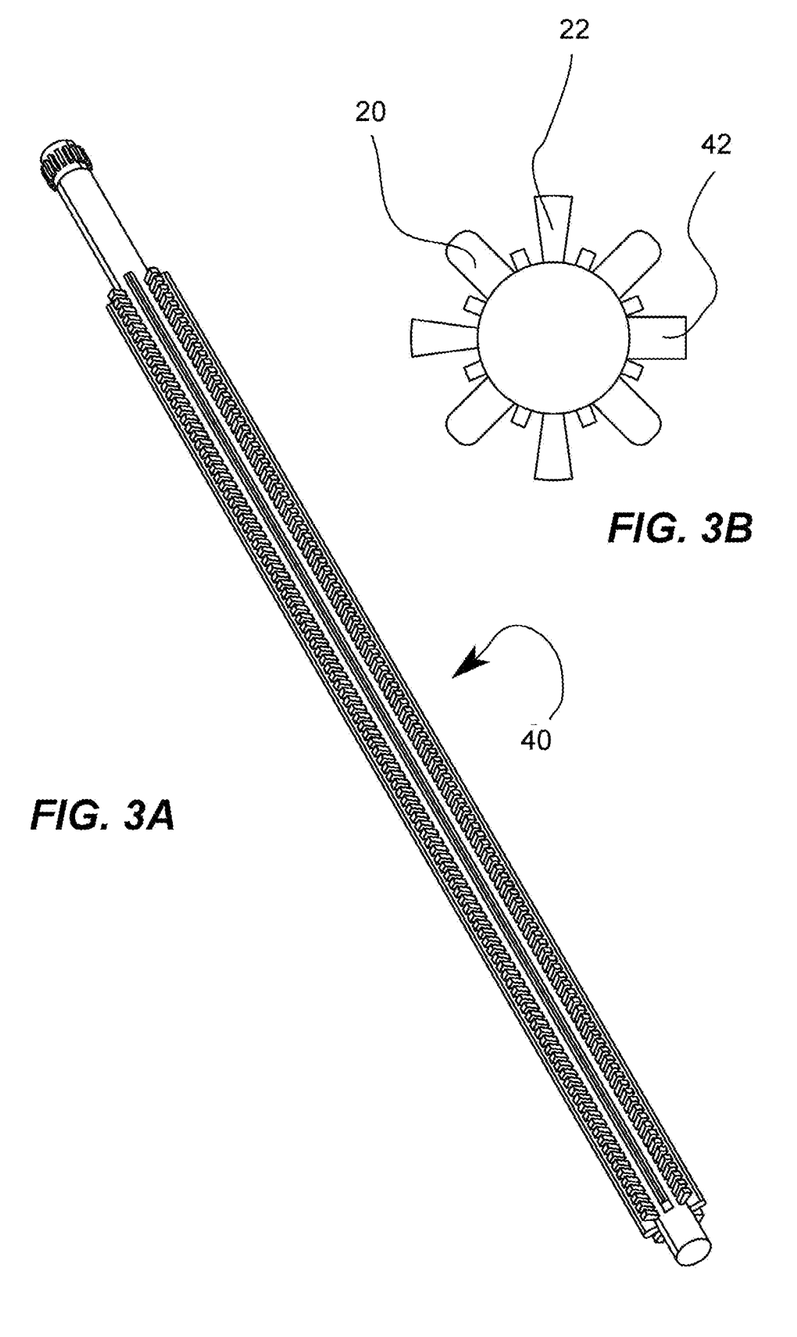
FIGS. 3A-B is an isometric and a side view of a rotating brush respectively according to an embodiment of the invention.

As best seen in FIGS. 3A-B, the roller 40 is comprised of hard scrubbers 42, brushes 22 and squeegees 20 (collectively referred to as "implements"). Since there are more than one set of each type, by rotating the roller 40, whenever an implement (scrubber, brush, and/or squeegee) is worn out, it can be replaced by simply rotating the roller 40 so as to present the appropriate implement. Typically, an electric motor (not shown) is used for rotating the roller so that a particular implement is in an operable position. Of course, in order to reduce cost by simplifying the invention, the blade 14 can be made out of only one squeegee.

In one embodiment, the pivot member 18 is further comprised of a base 30 which is mechanically fastened to the circular panel 12, a disc member 32, and an axis stub 34 which is pivotally connected to the base 30 by passing through holes 36 made through both the disc member 32 and the base 30.

In some embodiments, the pivot member 18 has a wind vane 26 on its top portion which is connected to a charger for generating the electricity needed to operate the system 10 such as rotating the blades 15, 17 and actuating all other electrically powered equipment such as pumps for the liquids and computer board, among others. Advantageously, in this manner, the system 10 does not take up the energy from the solar panels. Any excess energy produced can be stored in a battery for use on other systems if needed.

The second blade 17, which sits on top of the first blade 15, is used mostly for wiping excess snow and ejecting thawing fluid. This will be described in further details below. In one embodiment, the second blade 17 is comprised of a brush 22' extending upwardly therefrom. In one embodiment, the brush 22' is transparent such that it does not project a shadow on the circular panel 12. The blade 17 also contains other holes 39 for the injection of cleaning liquid to rinse and clean the brush 22'.

Figure 4:
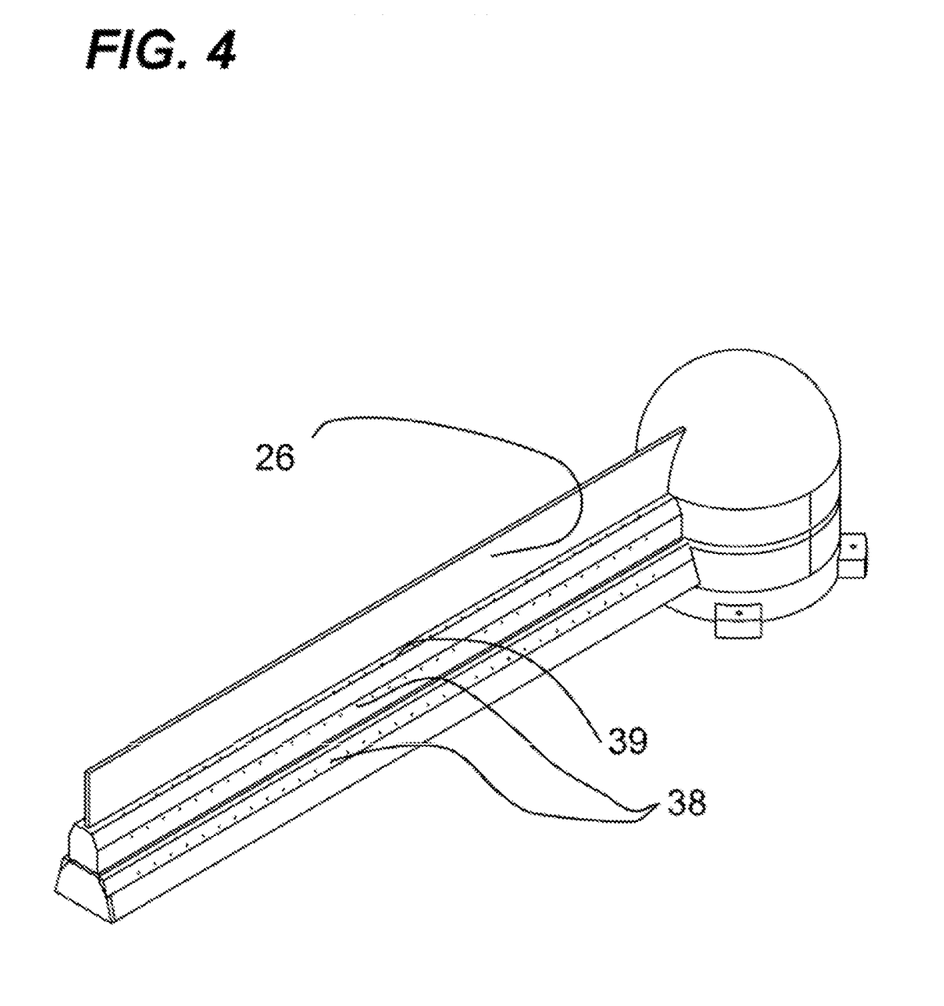
FIG. 4 is an isometric view of a model with sprinkler holes.

Additionally best seen in FIG. 4, in some embodiments, there are rows of sprinkler holes 38 and 39 for ejecting cleaning fluid from a channel within the blades (inside the body of the first and second blades 15, 17) to circulate and bring the fluid to the holes 38 and 39.

Advantageously, the two blades 15, 17 can rotate independently. For example, when there is a lot of snow, the second blade 17 moves first to clear the snow and sprinkle thawing liquid, and then the first blade 15 starts moving. Further, the blades 15, 17 can rotate clockwise or counter-clockwise. This is advantageous since the sprinklers are located on both sides of the blades 15, 17 (only one side visible in the drawings) and can contain different liquids. So, for example, if there is a need for a thawing liquid, the blade 15, 17 would turn in the direction the liquid is being sprinkled. When there is ice or frost on the panel which blocks the movement of the first blade 15, the second blade 17 is activated to inject the thawing liquid all along the panel in order to thaw the ice and release the first blade 15, and once the first blade 15 is released, it can be activated to clean the remaining ice on the panel.

Figures 5, 6:
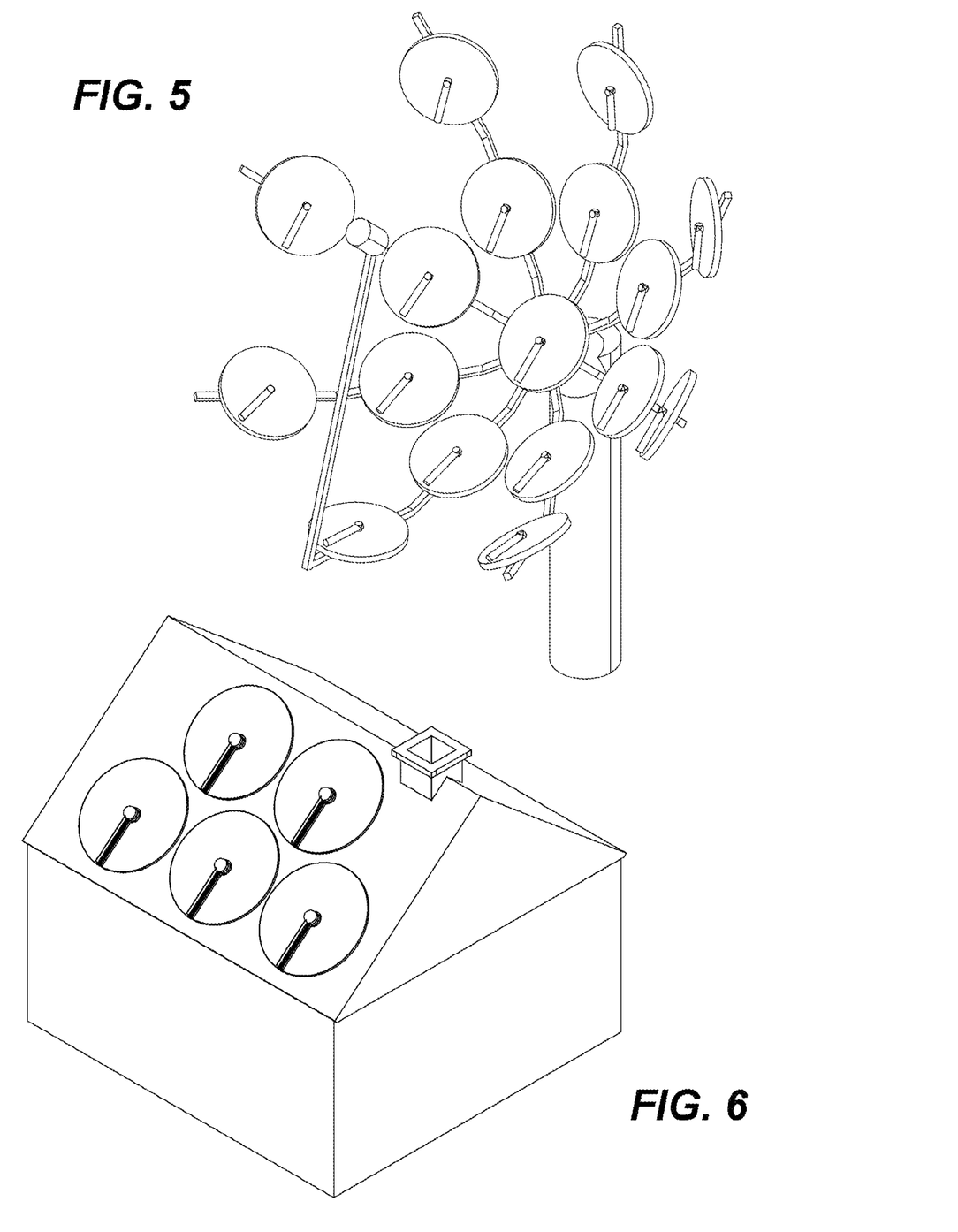
FIG. 5 is an isometric view of a parabolic installation.
FIG. 6 is an isometric view of an installation on a rooftop.
Figure 7:
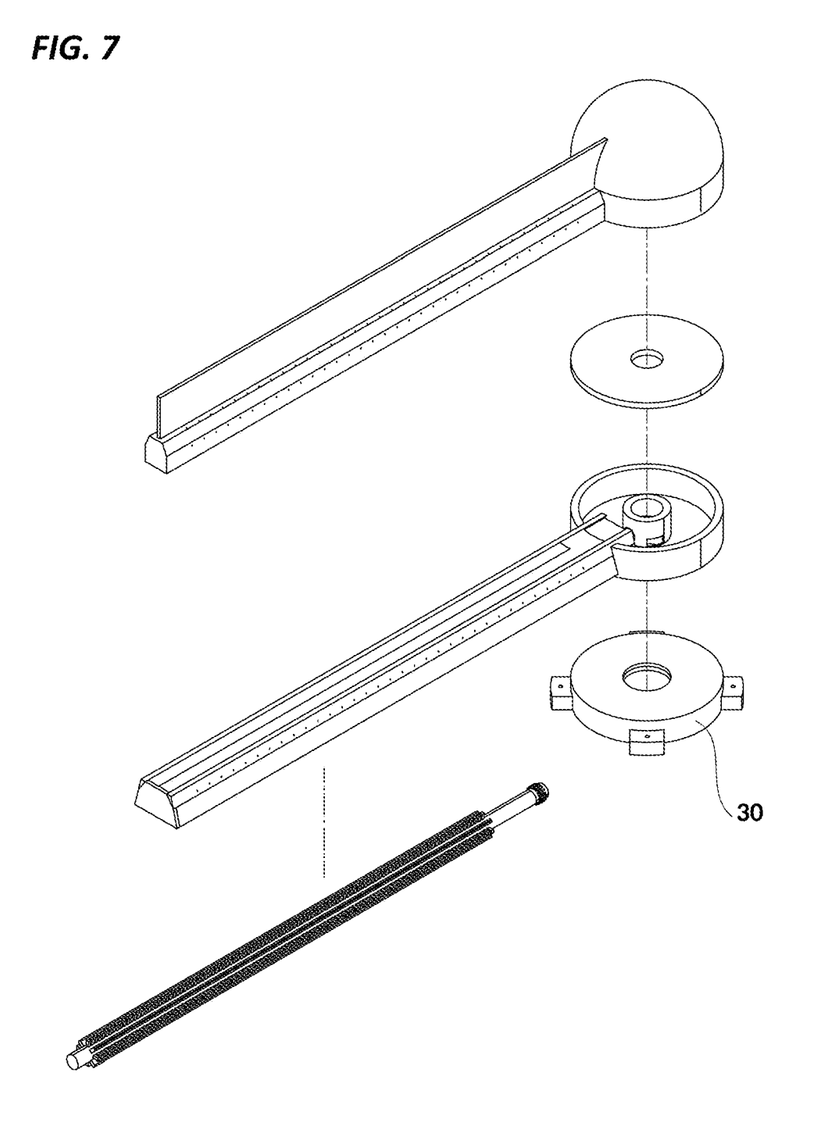
FIG. 7 is an exploded view of the invention without a wind vane.
Figure 8:
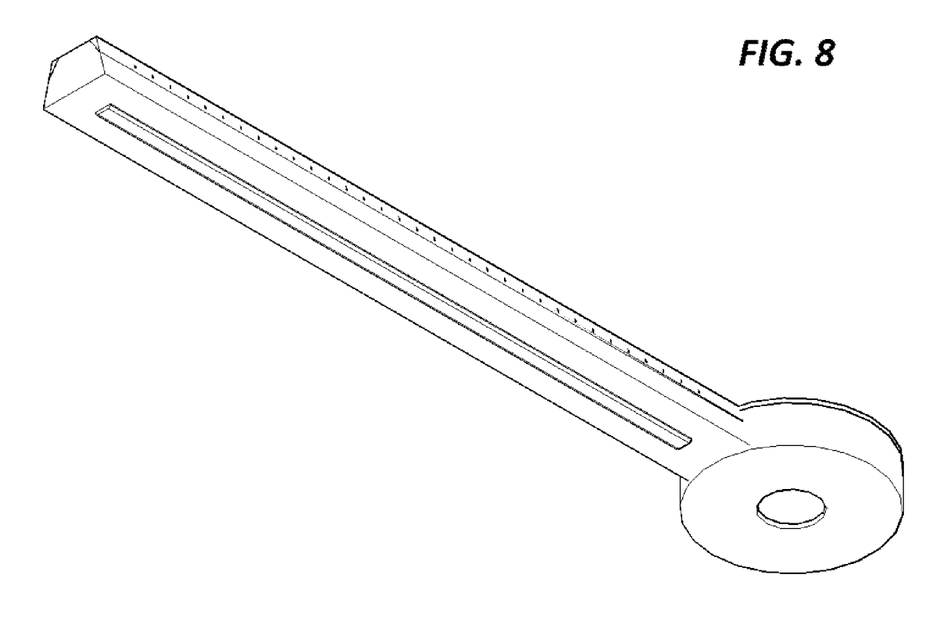
FIG. 8 is an isometric view favoring the underside of the rotating brush having only a single hard scrubber.
Figure 9:
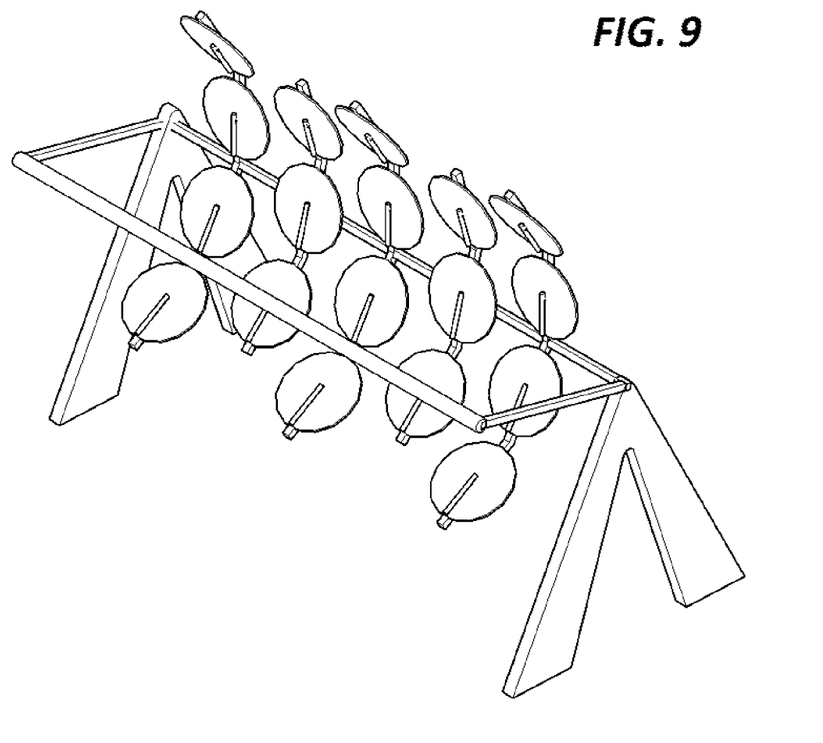
FIG. 9 is an isometric view of a cylindrical-parabolic reflectors installation.
Figure 10:
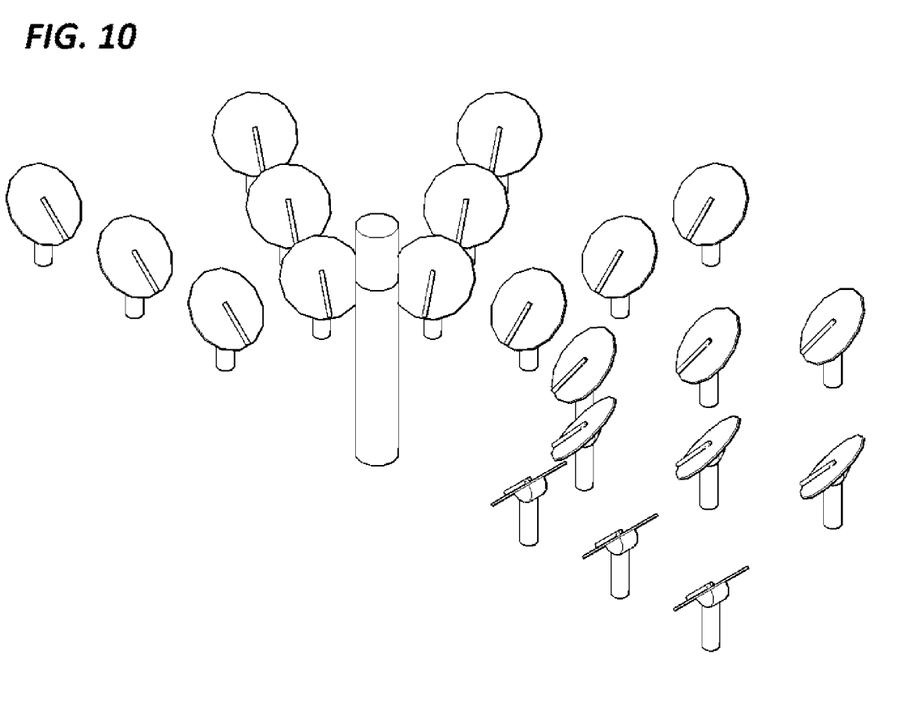
FIG. 10 is an isometric view of a solar tower installation.

Different configurations of mirrors can benefit from the blade 10 as seen in FIG. 5, where the blade 10 can be used on a mirror array for use with a parabolic solar oven, for example. FIG. 6 shows a rooftop installation using the blade 10, and FIG. 9 shows a cylindrical-parabolic reflectors. The system 10 can also be used for cleaning circular windows or skylights. For example, FIG. 10 shows a solar tower made out of circular panels.

As best seen in FIG. 6, in snowy regions the system 10 works very well on sloping roofs because it facilitates the removal of snow on the panels 12, which themselves prevent the accumulation of snow on the roof.

Another advantage of the sprinklers is that they can act as means for cooling the solar panels and prevent thermal shock that could cause the glass to crack, while also keep the panels from getting too hot as extreme heat reduces the photovoltaic efficiency.

Although the invention has been described in considerable detail in language specific to structural features, it is to be understood that the invention defined in the appended claims is not necessarily limited to the specific features described. Rather, the specific features are disclosed as exemplary preferred forms of implementing the claimed invention. Stated otherwise, it is to be understood that the phraseology and terminology employed herein, as well as the abstract, are for the purpose of description and should not be regarded as limiting. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, oblique, proximal, distal, parallel, perpendicular, transverse, longitudinal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) are not used to show a serial or numerical limitation but instead are used to distinguish or identify the various members of the group.

What is claimed is:

1. A cleaning system for a circular panel comprising:
a first blade having a proximal end pivotally connected to a pivot member;
a second blade having a proximal end pivotally connected to said pivot member, wherein the second blade can be moved independently of the first blade, wherein the second blade is configured to wipe snow off the circular panel, and wherein the first blade is capable of being located between the circular panel and the second blade when the first and second blades are connected to said pivot member;
wherein the pivot member comprises a base mechanically fastened to the circular panel;
wherein the pivot member comprises an axis stub pivotally connected to the base; and
wherein both the first and second blades are capable of fully rotating around the pivot member during cleaning of the circular panel.

2. The cleaning system of claim 1, wherein the first blade and the second blade are configured to rotate independently either in a clockwise or a counter clockwise direction.

3. The cleaning system of claim 2, wherein the first blade and the second blade each comprises at least one row of sprinkler holes configured to eject one or more fluids.

4. The cleaning system of claim 3, wherein the at least one row of sprinkler holes of the first blade is a pair of rows positioned on sides of the first blade, and wherein the at least one row of sprinkler holes of the second blade is a pair of rows positioned on sides of the second blade.

5. The cleaning system of claim 3, wherein the one or more fluids is a cleaning fluid configured to clean or cool the circular panel and a thawing fluid configured to thaw snow or ice from the circular panel.

6. The cleaning system of claim 1, wherein the first blade comprises a roller having implements, wherein the roller is configured to rotate via an electric motor.

7. The cleaning system of claim 6, wherein the implements include hard scrubbers, brushes, and squeegees.

8. The cleaning system of claim 1, wherein the second blade is configured to sit above the first blade.

9. The cleaning system of claim 8, wherein the second blade is comprised of a brush that extends upwardly.

10. The cleaning system of claim 1, further comprising a wind vane positioned on a top portion of the pivot member, wherein the wind vane is connected to a charger for generating electricity for operating the cleaning system.

11. The cleaning system of claim 1, wherein the circular panel is a solar panel.

12. A cleaning system for a circular panel comprising:
a pivot member comprising a base mechanically fastened to the circular panel;

an axis stub pivotally connected to the base;
a first blade and a second blade configured to rotate independently of each other about the pivot member in either a clockwise or a counter clockwise direction, wherein the second blade is configured to sit above the first blade, wherein the first blade comprises at least one row of sprinkler holes positioned on the first blade, and wherein the second blade comprises at least one row of sprinkler holes positioned on the second blade;
wherein both the first and second blades are capable of fully rotating around the pivot member during cleaning of the circular panel;
wherein the at least one row of sprinkler holes of the first blade and the at least one row of sprinkler holes of the second blade are configured to eject a fluid to either clean the circular panel, cool the circular panel, or thaw ice or snow on the circular panel; and,
wherein the first blade comprises a roller having cleaning implements configured to clean the circular panel as the first blade rotates about the pivot member.

* * * * *